United States Patent
Krivokapic

[19]

[11] Patent Number: 6,153,454
[45] Date of Patent: Nov. 28, 2000

[54] CONVEX DEVICE WITH SELECTIVELY DOPED CHANNEL

[75] Inventor: Zoran Krivokapic, Santa Clara, Calif.

[73] Assignee: Advanced Micro Devices, Inc., Sunnyvale, Calif.

[21] Appl. No.: 08/890,063

[22] Filed: Jul. 9, 1997

[51] Int. Cl.[7] .............................................. H01L 21/8238
[52] U.S. Cl. ...................... 438/225; 438/185; 438/217; 438/231; 438/289
[58] Field of Search .................................. 438/185, 217, 438/225, 231, 289

[56] References Cited

U.S. PATENT DOCUMENTS

| | | |
|---|---|---|
| 4,113,533 | 9/1978 | Okumura et al. . |
| 4,512,073 | 4/1985 | Hsu . |
| 5,075,242 | 12/1991 | Nakahara . |
| 5,290,718 | 3/1994 | Fearson et al. . |
| 5,407,849 | 4/1995 | Khambaty et al. . |
| 5,650,350 | 7/1997 | Dennison et al. . |
| 5,739,056 | 4/1998 | Dennison et al. . |
| 5,814,544 | 9/1998 | Huang . |

*Primary Examiner*—John F. Niebling
*Assistant Examiner*—Jonathan Hack
*Attorney, Agent, or Firm*—Fliesler, Dubb, Meyer & Lovejoy

[57] ABSTRACT

In manufacturing a transistor, a doping mask is formed above a substrate. The doping mask is constructed, so that a first region of the substrate for serving as a source in the transistor and a second region of the substrate for serving as a drain in the transistor are substantially shielded. Once the doping mask is formed, ions are introduced into a region in the substrate that is to underlie the transistor's gate structure. The ions are introduced to establish the characteristics of the transistor, such as the transistor's threshold voltage and punch-through breakdown voltage. After the ions are introduced, a gate oxide is formed to overlie a portion of the substrate. The gate structure for the transistor is then formed to substantially overlie the region of the substrate in which the ions have been introduced. Once a gate is formed for the gate structure, a source and drain are formed in the substrate. The source is formed in the substrate to extend outward from the gate and resides in the first region of the substrate. The drain is formed in the substrate to also extend outward from the gate and resides in the second region of the substrate.

36 Claims, 6 Drawing Sheets

CONVEX DEVICE WITH SELECTIVELY DOPED CHANNEL

BACKGROUND OF THE INVENTION

1. Field of the Invention

The present invention is directed toward the field of manufacturing integrated circuits.

2. Description of the Related Art

FIG. 1 illustrates a traditional metal oxide semiconductor ("MOS") field effect transistor 100, including a substrate 101 and a gate 102, which is separated from the substrate by a gate oxide 105. The substrate 101 is a wafer, which is made of a semiconductor material, such as silicon. A drain 103 and a source 104 are formed in the substrate 101. In a p-type MOS transistor, the substrate 101 is doped with n-type impurities, and the source 104 and drain 103 are doped with p-type ions. In a n-type transistor, the substrate 101 is doped with p-type impurities, and the source 104 and drain 103 are doped with n-type ions. The transistor 100 is isolated from the effects of other circuits and contacts (not shown) formed on the wafer by a field oxide 106.

The threshold voltage of a MOS transistor is a critical feature in determining the speed and power consumption of a MOS transistor. When the voltage potential between the transistor's gate and source exceeds the threshold voltage, a channel forms beneath the transistor's gate to enable current to flow between the transistor's source and drain. As the threshold voltage is reduced, the transistor's switching speed increases, but the transistor's power consumption increases.

Further, a MOS transistor should have a sufficiently high punch-through breakdown voltage to be reliable. If the punch-through breakdown voltage potential between the gate and source is exceeded during the operation of the transistor, current will flow further into the silicon substrate away from the gate, thereby causing the gate to lose its switching capability. A punch-through breakdown voltage in the range of 3 to 5 volts is desirable, but it should be at least 2 volts.

The substrate 101 on which the transistor 100 is formed may be doped with impurities to set the level of the transistor's threshold voltage and punch-through breakdown voltage. However, these impurities can impede the performance of the transistor 100 when they are diffused or implanted into regions of the substrate 101 in which the transistor's source 104 and drain 103 are to be formed. As a result of the impurities being present in the source 104 and drain 103, the mobility of the holes and electrons in the transistor's channel during operation is reduced, and the channel current is weakened.

FIG. 2(a) illustrates a step in the manufacturing process of the transistor 100 shown in FIG. 1. The source 104 and drain 103 have not yet been formed in the substrate 101. The substrate 101 is being doped with ions 115 to set the transistor's threshold voltage. Region 110 forms beneath the surface of the substrate 101 as a result of the doping.

FIG. 2(b) illustrates another step in the manufacturing process of the transistor 100 shown in FIG. 1. The substrate 101 has been doped to establish a threshold voltage for the transistor 100, but the source 104 and drain 103 have still not been formed. The substrate 101 is being doped with more ions 116 to set the transistor's punch-through breakdown voltage. Region 111 forms beneath region 110 in the substrate 101 as a result of the doping to set the punch-through breakdown voltage.

The regions 110, 111 formed in the substrate 101 by the threshold voltage and punch-through breakdown voltage impurities 115, 116 extend throughout the regions of the substrate 101 where the transistor's source 104 and drain 103 are to be formed. This causes the above mentioned reduction in mobility and current flow in the transistor's channel. In forming a MOS transistor, it is desirable to reduce the effects of threshold voltage implants and punch-through breakdown voltage implants on the strength of the channel current in the transistor.

Further, the upper surface of the substrate 101, as shown in FIGS. 1, 2(a), and 2(b), is substantially planar. This is not optimum for establishing a high avalanche breakdown voltage for the transistor 100. A high avalanche breakdown voltage is beneficial, because it ensures that the transistor 100 will have a sufficiently large operating region. Traditional MOS transistors have avalanche breakdown voltages in the range of 3 to 5 volts, but higher avalanche breakdown voltages are desirable.

SUMMARY OF THE INVENTION

In accordance with the present invention, a transistor may be formed in a manner that reduces the effects of threshold voltage implants and punch-through breakdown voltage implants on the strength of transistor channel current. Further, the substrate of such a transistor may have a surface topology that increases the transistor's avalanche breakdown voltage.

In embodiments of the present invention, a transistor may be formed on a substrate having a convex surface. A gate structure is formed to overlie the substrate and is separated from the substrate by a gate oxide. A source for the transistor is formed in the substrate to extend outward from a gate in the gate structure. The source resides in a first segment of the substrate which has an upper surface extending downwardly and outward from the gate. A drain for the transistor is formed in the substrate to also extend outward from the gate. The drain resides in a second segment of the substrate which has an upper surface extending downwardly and outward from the gate.

In manufacturing the transistor, a doping mask is formed, so that a first region and second region of the substrate are substantially shielded. The first region will serve as a source in the transistor, and the second region will serve as a drain in the transistor. The doping mask may be formed by a field oxide that is grown, during the manufacturing of the transistor. Next, ions are introduced into a region in the substrate that is to underlie the transistor's gate structure. The ions are introduced through the doping mask to establish the transistor's threshold voltage and punch-through breakdown voltage. No ions are directly implanted into the first and second regions of the substrate.

After the ions are introduced, a gate oxide is formed to overlie a portion of the substrate. The transistor's gate is then formed to overlie the region of the substrate in which the ions have been introduced. Once the gate is formed, a source is formed in the first region of the substrate and a drain is formed in the second region of the substrate.

BRIEF DESCRIPTION OF THE DRAWINGS

Further details of the present invention are explained with the help of the attached drawings in which.

DETAILED DESCRIPTION OF THE PREFERRED EMBODIMENTS

Figure 3A:
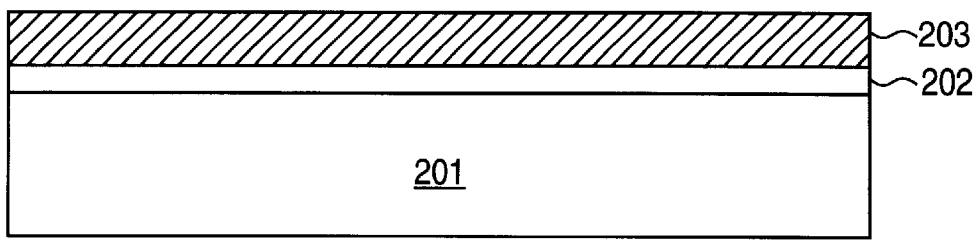
FIGS. 3(a)–3(o) illustrate the formation of a transistor in accordance with the present invention.
Figure 3B:
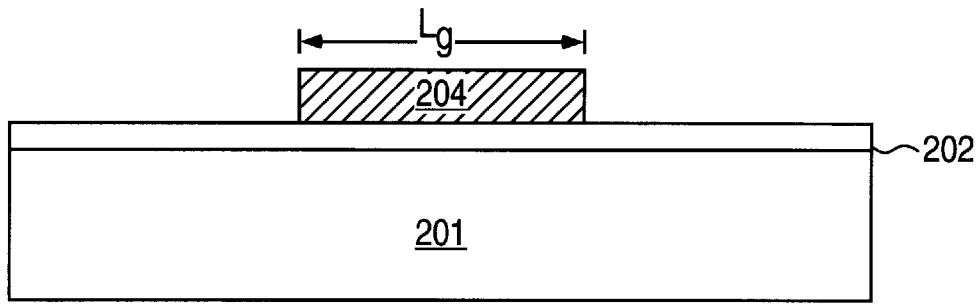
Figure 3C:
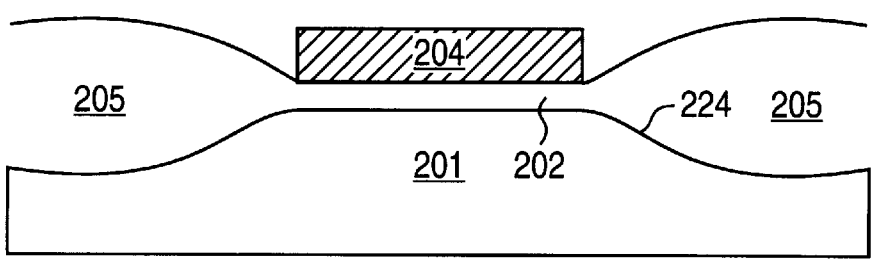
Figure 3D:
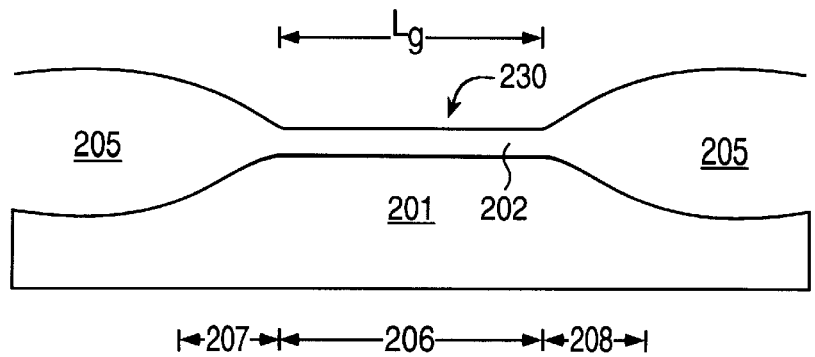
Figure 3E:
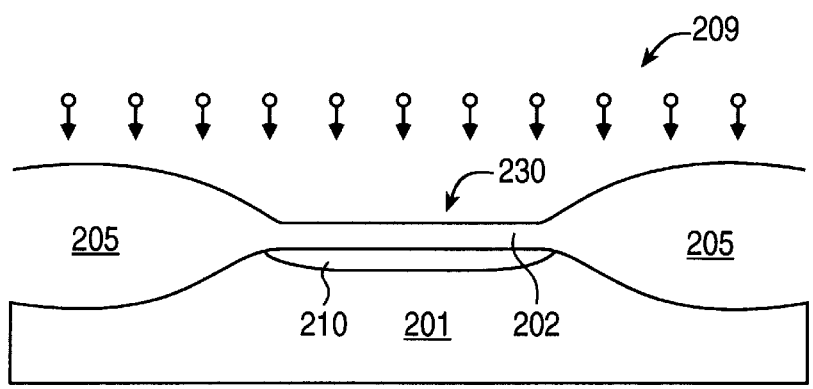
Figure 3F:
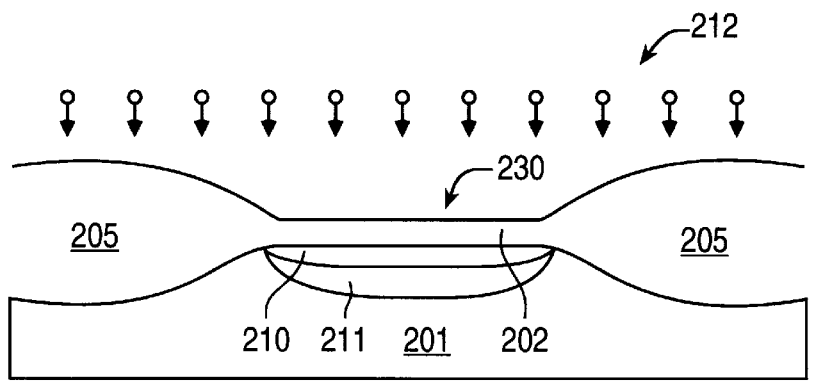
Figure 3G:
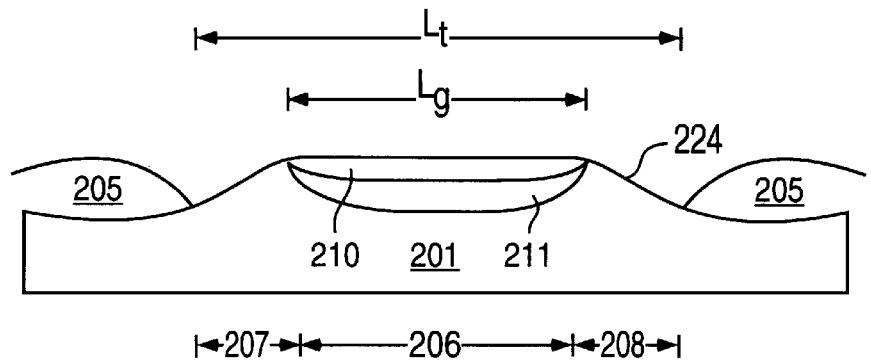
Figure 3H:
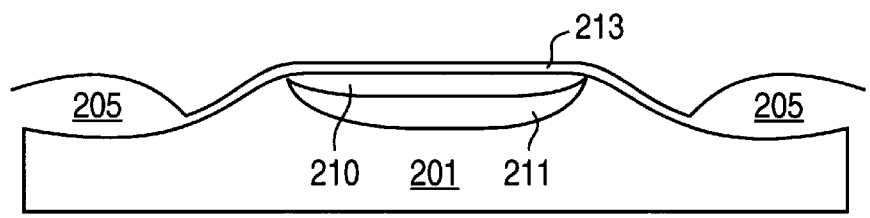
Figure 3I:
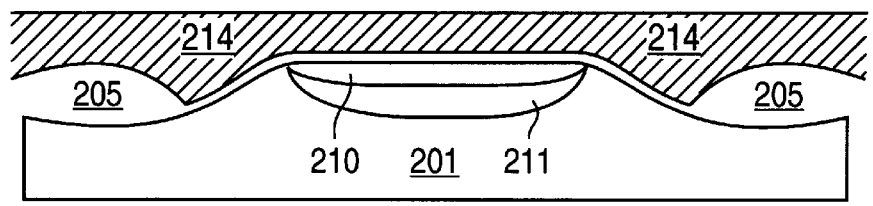
Figure 3J:
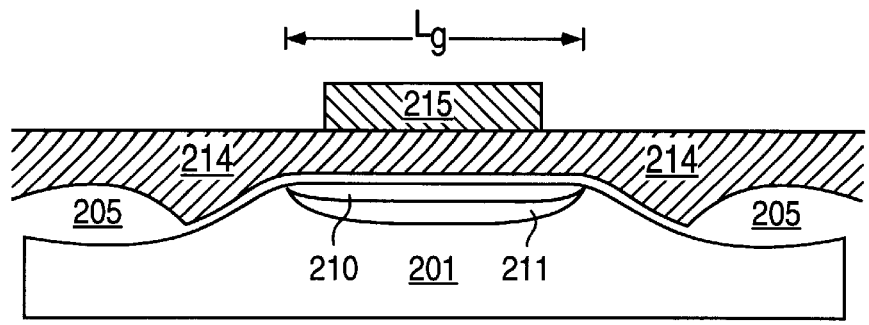
Figure 3K:
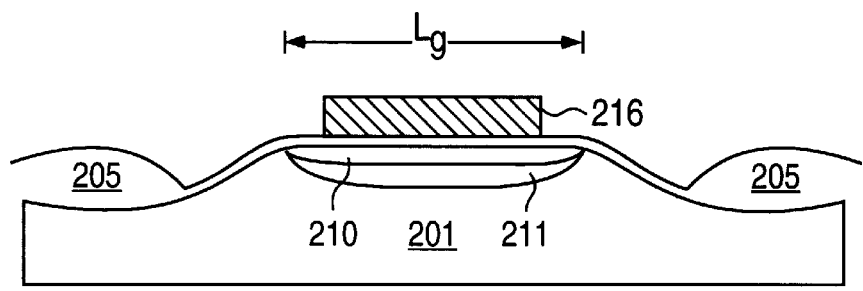
Figure 3L:
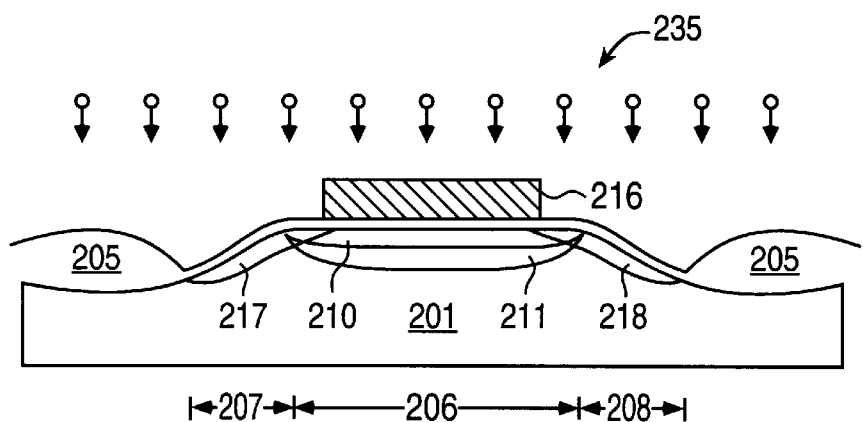
Figure 3M:
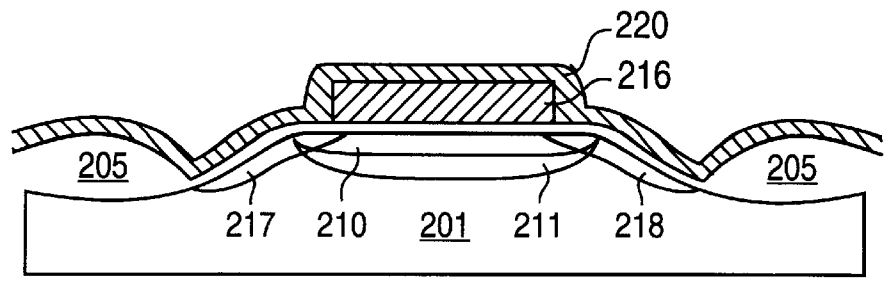
Figure 3N:
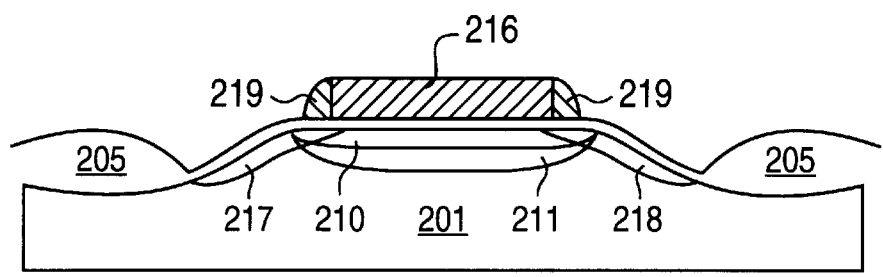
Figure 3O:
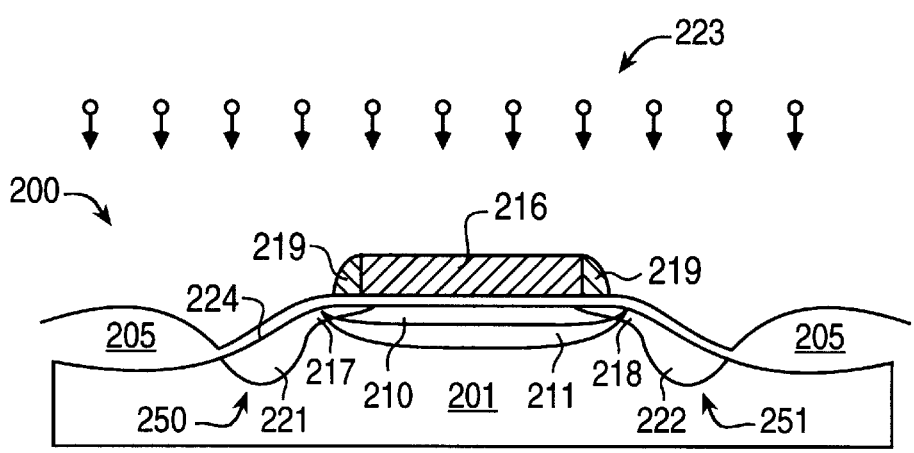

FIGS. 3(a)–3(o) illustrate the steps in a process for manufacturing a transistor 200 (FIG. 3(o)) in accordance with the present invention. This process provides for selectively introducing impurities into a region of the transistor's substrate that underlies the transistor's gate. These impurities are introduced to establish a threshold voltage and punch-through breakdown voltage for the transistor 200. The substrate regions in the transistor 200 that will serve as the majority of the source and drain regions are shielded from the introduction of these impurities to provide for improved channel current in comparison to traditionally formed transistors. The process also provides for the formation of the transistor 200 on a portion of a substrate that has a convex surface. The convex surface causes the transistor to have an increased avalanche breakdown voltage.

In manufacturing a transistor in accordance with the present invention, a doping mask is formed over the substrate to shield regions of the substrate in which the source and drain are to be created. The doping mask is employed during the introduction of the threshold voltage and punch-through breakdown voltage impurities. The formation of such a doping mask is important, since it shields source and drain substrate regions from these impurities.

FIG. 3(a) shows a substrate 201, such as a semiconductor wafer made from silicon or another semiconductor material. A thin insulative layer of material 202, such as silicon dioxide, is grown on top of the substrate 201 using a conventional oxidation procedure. The thin insulative layer of material 202 operates as a pad oxide to prevent the formation of stress dependent defects during subsequent oxidation. The pad oxide has a thickness in the range of 5 nanometers ("nm") to 20 nm.

A layer of silicon nitride 203 having a thickness in the range of 20 nm to 150 nm is then deposited on top of the pad oxide 202. The layer of silicon nitride may be deposited using conventional deposition procedures, such as low pressure chemical vapor deposition.

As shown in FIG. 3(b), the layer of silicon nitride 203 is patterned to form a gate template structure 204. The gate template structure has a gate structure length ($L_g$) that is substantially the same as a gate structure that the transistor 200 will have when it is formed. The gate structure, as will be described in greater detail below, may include a gate and a spacer material that surrounds the perimeter of the gate. Alternatively, the gate structure may consist of only a gate. The gate structure length ($L_g$) may be between 0.18 micrometers ("$\mu$m") and 0.38 $\mu$m. The layer of silicon nitride 203 is patterned to form the gate template structure 204 by using conventional photolithography. A layer of photoresist is deposited over the silicon nitride 203 and patterned to overlie a portion of the silicon nitride 204 that will form the gate template structure 204. The exposed silicon nitride 203 is then etched in a reactive ion etching ("RIE") plasma reactor. Once the etching is complete, the photoresist is stripped away to expose the gate template structure 204.

In traditional processes for forming a transistor, a gate template structure 204 is not formed. Instead, the layer of silicon nitride is patterned to have a length that spans the entire region of the substrate in which the transistor will be formed. A traditional field oxide is then formed around the conventionally patterned silicon nitride. This field oxide, as shown earlier in FIGS. 2(a) and 2(b), does not shield regions of the substrate in which the source and drain are to be formed. Consequently, threshold voltage impurities and punch-through breakdown voltage impurities have traditionally been directly introduced into regions of the substrate that are to serve as the source and drain, thereby providing for mobility degradation in the traditionally formed transistor.

Once the gate template structure 204 is constructed in accordance with the present invention, a field oxide 205 is grown to isolate the transistor 200 from other circuits that are formed on the substrate 201. The field oxide 205, which is shown in FIG. 3(c), may have a thickness in the range of 0.6 $\mu$m to 1.0 $\mu$m at its thickest point. The field oxide 205 is formed through a conventional oxidation process that provides for the growth of oxide from the pad oxide 202 on either side of the gate template structure 204. The field oxide growth can be achieved by exposing the pad oxide 202 to oxygen and infusing the oxygen with energy. The energy can be provided by heating the wafer.

Figure 2A:
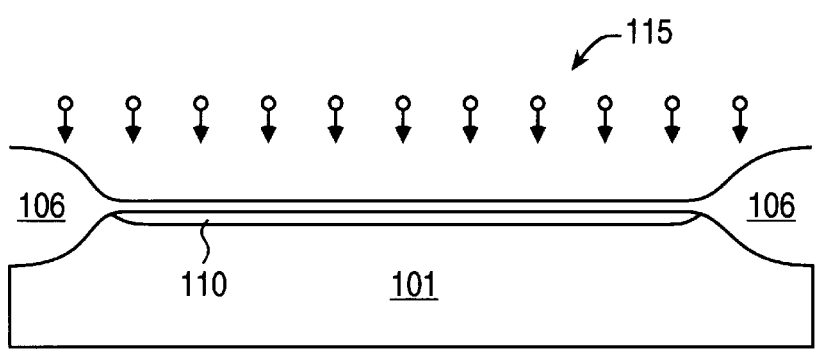
FIG. 2(a) illustrates a step in the manufacturing process for the transistor shown in FIG. 1.
Figure 2B:
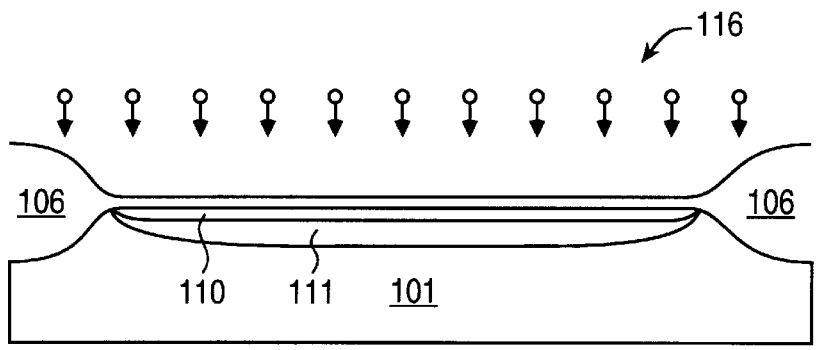
FIG. 2(b) illustrates another step in the manufacturing process for the transistor shown in FIG. 1.

The field oxide 205 grows outward from the pad oxide 202 to extend both above the existing pad oxide 202 and into the substrate 201. As a result, the substrate's surface 224 takes on a convex shape within a region of the substrate 201 in which a transistor is to be formed. As shown in FIG. 3(c), regions of the substrate surface 224 extending outward from the gate template structure 204 slope downwardly. The field oxide 205 may be composed of silicon dioxide. When a gate template structure 204 is not formed, and the field oxide is traditionally grown, as shown in FIGS. 2(a) and 2(b), the surface of the substrate remains substantially planar within the region in which the transistor 100 is to be formed.

As shown in FIG. 3(d), the gate template structure 204 is removed, once the field oxide 205 has been formed. The removal of the gate template structure 204 exposes a mask window 230 in the doping mask formed by the pad oxide 202 and field oxide 205. The mask window 230 extends between the boundaries of the field oxide 205 and includes the area of the pad oxide 202 that was covered by the gate template structure 204. The gate template structure 204 may be removed through a conventional etching process that provides for the decomposition of silicon nitride and does not etch either the pad oxide 202 or the field oxide 205. Hot phosphoric acid having a temperature of approximately 180° C. may be employed as the etchant.

The doping mask formed by the field oxide 205 and pad oxide 202 provides for introducing impurities into the region 206 of the substrate 201 that underlies the 204 mask window 230. As will be shown below, the transistor's gate structure will be formed over this same region 206, which will be referred to as the gate structure region 206. The doping mask also acts as a shield to impede the introduction of doping impurities into the regions 207, 208 of the substrate 201 that are juxtaposition the gate structure region 206. As will be shown below, the transistor's source will be substantially formed in substrate region 207 and the transistor's drain will be substantially formed in substrate region 208.

The gate structure region 206 is doped with impurities through the mask window 230 to establish the transistor's threshold voltage and punch-through breakdown voltage. As shown in FIG. 3(e), an ion implantation procedure may be employed to introduce threshold voltage impurities 209 into the substrate 201. In an ion implantation procedure, ions 209 are accelerated into the doping mask. The thicker regions of the doping mask that are formed by the field oxide 205 prevent the accelerated ions from reaching the substrate 201.

The mask window 230 of the doping mask allows the accelerated ions 209 to penetrate into substrate region 206 to form a first doped region 210. The first doped region 210 extends laterally to span approximately the length of the gate structure region 206. The first doped region extends below the surface of the substrate 201 a distance in the range of 0.05 $\mu$m to 0.08 $\mu$m.

When a n-channel transistor is being formed in accordance with the present invention, a p-type impurity, such as boron, indium, or boron diflouride ($BF_2$), is implanted. The ion implantation may be performed at a voltage range of 10–120 kilo-electron volts ("KeV") and $1e^{12}$–$1e^{13}$ atoms per square centimeter ("$cm^{-2}$"). When a p-channel transistor is being formed in accordance with the present invention, a n-type impurity, such as phosphorus, arsenic or animonium, is implanted. The ion implantation may be performed at a voltage range of 100–250 KeV and $1e^{12}$–$1e^{13}$ atoms $cm^{-2}$.

Next, a second doped region 211 is formed in the substrate 201 to establish a punch-through breakdown voltage for the transistor 200 by introducing an impurity into the substrate 201. As shown in FIG. 3(f), an ion implantation procedure may be employed to introduce punch-through breakdown voltage impurity ions 212 into the substrate 201. As described above, the thicker regions of the doping mask block the accelerated ions. The mask window 230 allows the accelerated ions to penetrate into the substrate 201 to form the second doped region 211. The second doped region 211 also extends laterally to span approximately the length of the substrate's gate structure region 206. The second doped region 211 extends below the surface of the substrate 201 a distance in the range of 0.10 $\mu$m to 0.30 $\mu$m.

When a n-channel transistor is being formed in accordance with the present invention, a p-type impurity, such as boron, is implanted to form region 211. The ion implantation may be performed at a voltage range of 50–250 KeV and $1e^{12}$–$1e^{13}$ atoms $cm^{-2}$. When a p-channel transistor is being formed in accordance with the present invention, a n-type impurity, such as arsenic or phosphorous, is implanted.

The ion implantation may be performed at a range of 150–1500 KeV and $1e^{-12}$–$1e^{13}$ atoms $cm^{-2}$.

Although ion implantation has been described as a method for introducing the threshold voltage and punch-through breakdown voltage impurities, one with ordinary skill in the art will recognize that other doping processes may be employed. For example, a thermally energized diffusion process may be used to form the first doped region 210 and the second doped region 211.

Once the substrate 201 has been doped with the threshold voltage and punch-through breakdown voltage impurities, a gate oxide is constructed. As shown in FIG. 3(g), the first step in constructing a gate oxide is to remove the pad oxide 202 and portions of the field oxide 205. This may be achieved by performing a wet etch on the surface of the doping mask. The wet etch is performed for a time in the range of 1 minute to 20 minutes to isotropically etch the pad oxide 202 and field oxide 205. The etchant may be hydrofluoric acid combined with ammonia, fluoride and water which will etch away the oxide but not the material that composes the substrate 201.

As a result of the etching, the pad oxide 202 is stripped away to expose a portion of the substrate's surface. The field oxide 205 is reduced by approximately 0.20 $\mu$m to 0.30 $\mu$m so that the field oxide 205 has a thickness in the range of 0.40 $\mu$m to 0.50 $\mu$m at its thickest point. The exposed portion of the substrate's surface extends outward from the gate structure region 206 and has a length that includes the substrate regions 207, 208 in which the transistor's source and drain will primarily be formed. The length of the exposed portion of the substrate will be referred to as the transistor length ($L_t$) and has a distance in the range of 0.20 $\mu$m to 0.40 $\mu$m.

Figure 1:
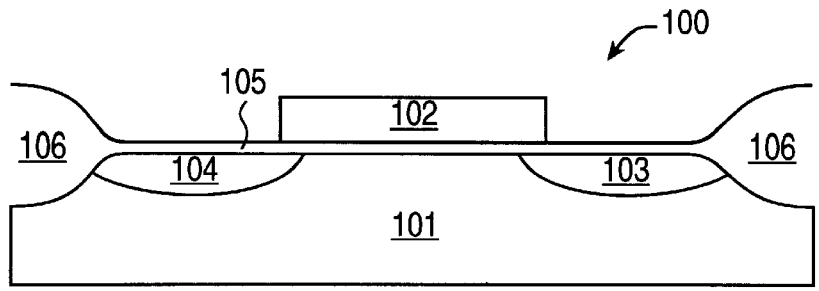
FIG. 1 illustrates a traditional MOS transistor.

Further, the exposed portion of the substrate's surface 224 is substantially convex with downward sloping regions extending outward from the upper surface of the gate structure region 206. This contrasts with the substantially planar substrate upper surface that is found in traditional transistors, as shown in FIGS. 1, 2(a), and 2(b).

Once the surface of the substrate 201 is exposed, a gate oxide 213 is formed. As shown in FIG. 3(h), the gate oxide 213 may be grown using conventional thermal oxidation techniques. This causes the gate oxide 213 to grow over the substrate's surface 224 and the thickness of the field oxide 205 to be increased. The thickness of the gate oxide 213 and increase in the field oxide 205 thickness may be in the range of 30 nm to 60 nm. The gate oxide 213 may be composed of silicon dioxide, silicon oxide or silicon oxynitride.

Once the gate oxide 213 is formed, a gate structure is constructed for the transistor. The gate structure is constructed to substantially overlie the gate structure region 206 of the substrate 201 and have a length substantially equal to the gate structure length ($L_g$). FIG. 3(i) shows the formation of a layer of conductive material 214, such as polysilicon, over the gate oxide 213 and field oxide 205. The layer of conductive material 214 may be formed by first depositing the conductive material 214 and then leveling the surface of the deposited conductive material 214. The deposition may be performed by a number of different conventional procedures, such as low pressure chemical vapor deposition. The leveling may also be performed by a conventional process, such as chemical mechanical polishing.

In FIG. 3(j), a layer of photoresist 215 is patterned over a region of the conductive material 214 that will serve as the transistor's gate. The photoresist is deposited over the layer of conductive material 214 and patterned with the use of a photo mask. The patterned photoresist 215 is patterned to lie substantially within the boundaries of the gate structure region 206 of the substrate 201 and has a length that is less than or equal to the gate structure length ($L_g$).

In FIG. 3(k), the exposed portion of the layer of conductive material 214 is etched and the photoresist 215 is subsequently stripped away. As a result, a gate 216 for the transistor is formed having a length within the range of the gate structure length ($L_g$) and overlying the gate structure region 206 of the substrate 201. The etching is performed using conventional dry etching techniques to anisotropically etch the conductive material 214.

After the gate 216 is constructed, the source and drain for the transistor are formed. The first step in forming the source and drain is shown in FIG. 3(l). In FIG. 3(l), impurities 235 are introduced into the substrate 201 to form a shallow source region 217 and a shallow drain region 218 which both undercut the gate 216. The impurities 235 may be introduced using an ion implantation procedure. The impurity ions 235 are accelerated through the gate oxide 213 and into the downward sloping regions of the substrate 201 between the gate 216 and the field oxide 205. Both the gate 216 and field oxide 205 shield their respective underlying substrate regions from being implanted with ions 235. The portions of regions 217 and 218 that undercut the gate 216 are a result of the implanted ions diffusing within the substrate 201 once they are implanted. As a result of the shallow ion implantation, the shallow source region 217 and shallow drain region 218 each extend below the surface of the substrate for a distance between 0.03 μm to 0.10 μm.

When a n-channel transistor is being formed in accordance with the present invention, a n-type impurity, such as phosphorous or arsenic, serves as the source/drain impurity 235. The ion implantation may be performed at a voltage range of 10–50 KeV and $3e^{14}$–$6e^{14}$ atoms $cm^{-2}$. When a p-channel transistor is being formed in accordance with the present invention, a p-type impurity, such as boron, is introduced. The ion implantation may be performed at a voltage range of 5–25 KeV and $3e^{14}$–$6e^{14}$ atoms $cm^{-2}$.

Once the shallow source and drain implants are made, spacers 219 are formed to extend from the sides of the gate 216 to form the gate structure. The spacers 219 provide for making deeper source and drain regions to complete the formation of the source and drain. The first step in forming the spacers 219 is to deposit a layer of spacer material 220, such as a nitride, oxynitride, oxide, or polysilicon over the gate 216, gate oxide 213, and field oxide 205 as shown in FIG. 3(m). The layer of spacer material 220 has a thickness in the range of 0.08 μm to 0.10 μm and may be deposited using a traditional deposition procedure. Such a deposition procedure may be chemical vapor deposition or plasma enhanced chemical vapor deposition.

The next step in forming the spacers 219 is to anisotropically etch the layer of spacer material 220 to form the structure shown in FIG. 3(n). The anisotropic etch may be performed using a conventional dry etching procedure that removes all of the spacer material 220, except spacers 219 that are juxtapositioned each side of the gate 216. The spacers 219 extend outward from the gate 216 on the substrate's surface for a distance in the range of 0.08 μm to 0.09 μm.

Once the spacers 219 are formed, deeper source and drain impurity introductions are performed, as shown in FIG. 3(o), to complete the formation of the transistor's source 250 and drain 251. Once again, an ion implantation procedure may be employed to implant ions 223 into the substrate 201. The gate 216, spacers 219, and field oxide 205 shield their respective underlying substrate 201 regions from being implanted with the source and drain impurities 223. As a result, a deep source region 221 and a deep drain region 222 are formed. Each of these regions 221 and 222 extends into the substrate 201 from the edge of the field oxide 205 to the edge of the nearest spacer 219. However, a small portion of each deep region 221 and 222 may diffuse in the substrate to underlie the field oxide 205 and spacers 219. Each deep region 221 and 222 extends downward from the substrate's surface 224 for a distance in the range of 0.06 μm to 0.10 μm. The deep source region 221 and shallow source region 217 combine to form the source 250, and the deep drain region 222 and shallow drain region 222 combine to form the drain 251.

When a n-channel transistor is being formed in accordance with the present invention, a n-type impurity, such as phosphorous or arsenic, serves as the source/drain implant. The ion implantation may be performed at a voltage range of 10–40 KeV and $4e^{15}$–$6e^{15}$ atoms $cm^{-2}$. When a p-channel transistor is being formed in accordance with the present invention, a p-type impurity, such as boron or $BF_2$, is implanted. The ion implantation may be performed at a voltage range of 10–30 KeV and $4e^{15}$–$6e^{15}$ atoms $cm^{-2}$.

As shown in FIG. 3(o), the completed transistor 200 is formed on a convex substrate surface 224. The gate 216 resides above the highest region of the convex substrate surface 224 and is separated from the substrate surface 224 by the gate oxide 213. The gate 216 extends laterally above the substrate surface 224 until substrate surface 224 begins to slope downward. Underlying the downward sloping regions of the substrate surface 224 are the source 250 and drain 251.

The convex shape of the substrate's surface 224 results in the avalanche breakdown voltage of the transistor 200 being in the range of 5 to 8 volts. This provides significant improvement over the avalanche breakdown voltage found in traditional MOS transistors which are formed without using a gate template structure 204 to construct a doping mask. The planar substrate surfaces in such traditional transistors result in the transistors having avalanche breakdown voltages in the range of 3 to 5 volts.

The implanted threshold voltage impurities and punch-through breakdown voltage impurities are primarily contained within the substrate's gate structure region 206 underneath the gate structure formed by the gate 216 and the spacers 219. Unlike in traditionally formed transistors, the threshold voltage impurities and punch-through breakdown voltage impurities do not extend significantly throughout the source 250 and drain 251. The reduction of impurities in the source 250 and drain 251 enhances the current strength and mobility of holes and electrons in the transistor's 200 channel during operation.

Although the invention has been described above with particularity, this was merely to teach one of ordinary skill in the art how to make and use the invention. Many modifications will fall within the scope of the invention, as that scope is defined by the following claims.

What is claimed is:

1. A method for forming a transistor on a substrate, said method comprising the steps of:

(a) forming a doping mask comprising at least a first element over a first region of substrate and a second element over a second region of substrate, each element having a first maximum thickness, so that said first region of the substrate and said second region of the substrate are substantially shielded from doping impurities and a gate structure region of the substrate is not shielded from doping impurities, wherein said first region is to have a source for the transistor formed therein and said second region is to have a drain for the transistor formed therein, and wherein said gate structure region is to underlie a gate for the transistor;

(b) introducing ions into said gate structure region of the substrate between said elements of said doping mask; and (c) reducing the thickness of each of said first and second elements to a second thickness about 0.5 to about 0.66 of the first thickness, thereby exposing a convex portion of said substrate to a degree enabling avalanche breakdown voltage to be greater than about 5 volts.

2. The method of claim 1, wherein said step (a) includes the steps of:

forming an insulative layer of material on said substrate;

forming a gate template structure on top of said insulative layer of material, wherein said gate template structure has a length that is substantially equal to or less than a length of a gate structure and resides over said gate structure region of said substrate, wherein said gate structure includes said gate;

growing a field oxide from said insulative layer of material, wherein said field oxide extends outward from said gate template structure, upward from said insulative layer of material, and into said substrate; and removing said gate template structure.

3. The method of claim 2, wherein said gate structure region extends from a first edge of said field oxide to a second edge of said field oxide.

4. The method of claim 3, wherein said gate structure region has a length in a range of 0.18 µm to 0.38 µm.

5. The method of claim 4, wherein said gate structure includes spacers extending from said gate.

6. The method of claim 2, wherein said field oxide extends into said substrate so as to cause portions of an upper surface of said substrate to slope downwardly, wherein said portions of said upper surface overlie the first region of said substrate and said second region of the substrate.

7. The method of claim 6, wherein said portions of said upper surface of said substrate include a first region of said upper surface of said substrate extending outward from a first side of said gate template structure and a second region of said upper surface of said substrate extending outward from a second side of said gate template structure.

8. The method of claim 7, wherein said first region of said upper surface of said substrate overlies said first region of said substrate and said second region of said upper surface of said substrate overlies said second region of said substrate.

9. The method of claim 2, wherein said length of said gate template structure is in a range of 0.18 µm to 0.38 µm.

10. The method of claim 2, wherein said insulative layer of material is silicon dioxide.

11. The method of claim 2, wherein said gate template structure is composed of silicon nitride.

12. The method of claim 1, wherein said step (b) includes the step of:
implanting a first set of ions into said gate structure region of said substrate through said doping mask.

13. The method of claim 12, wherein said first set of ions establishes a threshold voltage for the transistor.

14. The method of claim 12, wherein said step (b) further includes the step of:
implanting a second set of ions into said gate structure region of said substrate through said doping mask.

15. The method of claim 14, wherein said second set of ions establishes a punch-through breakdown voltage for the transistor.

16. The method of claim 14, wherein said first set of ions and said second set of ions are not implanted into either said first region of the substrate or said second region of the substrate.

17. The method of claim 1, further including the steps of:
(d) forming a gate oxide for the transistor on said portion of said upper surface of the substrate;
(e) forming a gate structure for the transistor on top of said gate oxide, wherein said gate structure substantially overlies said gate structure region of the substrate; and
(f) forming the source of the transistor in said first region of the substrate and the drain of the transistor in said second region of the substrate.

18. The method of claim 17, wherein said step (e) includes the step of:
forming a gate for said gate structure; and
forming a spacer for said gate structure, wherein said spacer extends outward from said gate.

19. The method of claim 17, wherein said step (f) includes the steps of:
implanting a first set of ions into said first region of the substrate to a first depth and said second region of the substrate to a second depth;
forming spacers extending outward from a gate in said gate structure; and implanting a second set of ions into said first region of the substrate to a third depth and said second region of the substrate to a fourth depth.

20. The method of claim 19, wherein said first depth and said second depth are in a range of 0.03 µm to 0.10 µm.

21. The method of claim 19, wherein said third depth and said fourth depth are in a range of 0.06 µm to 0.10 µm.

22. A method for forming a transistor on a substrate, said method comprising the steps of:
(a) forming an insulative layer of material on the substrate;
(b) forming a gate template structure on top of said insulative layer of material, wherein said gate template structure has a length that is substantially equal to or less than a length of a gate structure for the transistor and resides over a region of said substrate which will be overlaid by said gate structure;
(c) growing a field oxide having a first thickness from said insulative layer of material, wherein said field oxide extends outward from said gate template structure, upward from said insulative layer of material, and into the substrate;
(d) removing said gate template structure to expose a mask window portion of said insulative layer of material;
(e) introducing ions into the substrate through said mask window portion of said insulative layer of material; and
(f) reducing the thickness of a portion of said field oxide to a second thickness about 0.5 to about 0.66 of the first thickness, thereby exposing a convex portion of an upper surface of said substrate to a degree enabling avalanche breakdown voltage to be greater than about 5 volts.

23. The method of claim 22, wherein said insulative layer of material is a pad oxide.

24. The method of claim 22, wherein said field oxide extends into the substrate so as to cause portions of an upper surface of said substrate to extend downwardly.

25. The method of claim 24, wherein said portions of said upper surface of said substrate include a first region of said upper surface of said substrate extending outward from a first side of said gate template structure and a second region of said upper surface of said substrate extending outward from a second side of said gate template structure.

26. The method of claim 25, wherein said first region of said upper surface of said substrate overlies a region of said substrate in which a source for the transistor will be formed and said second region of said upper surface of said substrate overlies a region of said substrate in which a drain will be formed.

27. The method of claim 26, wherein said step (e) includes the step of:
implanting a first set of ions into the substrate through said mask window portion of said insulative layer of material.

28. The method of claim 27, wherein said first set of ions establishes a threshold voltage for the transistor.

29. The method of claim 27, wherein said step (e) further includes the step of:
implanting a second set of ions into the substrate through said mask window portion of said insulative layer of material.

30. The method of claim 29, wherein said second set of ions establishes a punch-through breakdown voltage for the transistor.

31. The method of claim 29, wherein said first set of ions and said second set of ions are not implanted into said substrate through either said first region of said upper surface of the substrate or said second region of said upper surface of the substrate.

32. The method of claim 22, further including the steps of:
   (g) forming a gate oxide for the transistor on said portion of said upper surface of said substrate;
   (h) forming said gate structure for the transistor on top of said gate oxide, wherein said gate structure substantially overlies a region of said substrate that underlay said mask window portion of the insulative layer of material; and
   (i) forming the source and the drain of the of the transistor.

33. The method of claim 1, wherein the first thickness is in the range of about 0.6 $\mu$m to about 1.0 $\mu$m and the second thickness is in the range of about 0.4 $\mu$m to about 0.5 $\mu$m.

34. The method of claim 22, wherein the first thickness is in the range of about 0.6 $\mu$m to about 1.0 $\mu$m and the second thickness is in the range of about 0.4 $\mu$m to about 0.5 $\mu$m.

35. A method for forming a transistor on a substrate, said method comprising the steps of:
   (a) forming a doping mask comprising at least a first element over a first region of substrate and a second element over a second region of substrate, each element having a first maximum thickness, so that said first region of the substrate and said second region of the substrate are substantially shielded from doping impurities and a gate structure region of the substrate is not shielded from doping impurities, wherein said first region is to have a source for the transistor formed therein and said second region is to have a drain for the transistor formed therein, and wherein said gate structure region is to underlie a gate for the transistor;
   (b) introducing ions into said gate structure region of the substrate between said elements of said doping mask; and
   (c) reducing the thickness of said doping mask to a second thickness about 0.5 to about 0.66 of the first thickness, thereby exposing a convex portion of said substrate to a degree enabling avalanche breakdown voltage to be about 8 volts.

36. A method for forming a transistor on a substrate, said method comprising the steps of:
   (a) forming an insulative layer of material on the substrate;
   (b) forming a gate template structure on top of said insulative layer of material, wherein said gate template structure has a length that is substantially equal to or less than a length of a gate structure for the transistor and resides over a region of said substrate which will be overlaid by said gate structure;
   (c) growing a field oxide having a first thickness from said insulative layer of material, wherein said field oxide extends outward from said gate template structure, upward from said insulative layer of material, and into the substrate;
   (d) removing said gate template structure to expose a mask window portion of said insulative layer of material;
   (e) introducing ions into the substrate through said mask window portion of said insulative layer of material; and
   (f) reducing the thickness of a portion of said field oxide to a second thickness about 0.5 to about 0.66 of the first thickness, thereby exposing a convex portion of an upper surface of said substrate to a degree enabling avalanche breakdown voltage to be about 8 volts.

* * * * *